(12) United States Patent
Ishikawa et al.

(10) Patent No.: US 7,881,404 B2
(45) Date of Patent: Feb. 1, 2011

(54) DISTORTION CORRECTION CONTROL APPARATUS AND DISTORTION CORRECTION CONTROL METHOD

(75) Inventors: Hiroyoshi Ishikawa, Kawasaki (JP); Kazuo Nagatani, Kawasaki (JP); Hajime Hamada, Kawasaki (JP); Nobukazu Fudaba, Kawasaki (JP); Yuichi Utsunomiya, Kawasaki (JP); Yasuyuki Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/567,510

(22) Filed: Sep. 25, 2009

(65) Prior Publication Data

US 2010/0062733 A1 Mar. 11, 2010

Related U.S. Application Data

(63) Continuation of application No. PCT/JP2007/056664, filed on Mar. 28, 2007.

(51) Int. Cl.
*H04L 25/49* (2006.01)
*H03C 3/08* (2006.01)

(52) U.S. Cl. .................................. 375/296; 332/123
(58) Field of Classification Search ................ 375/285, 375/295–297; 455/114.2, 114.3, 91; 332/106, 332/107, 123, 124, 159, 160
See application file for complete search history.

(56) References Cited

U.S. PATENT DOCUMENTS

| | | | |
|---|---|---|---|
| 5,870,668 A | 2/1999 | Takano | |
| 5,903,823 A | 5/1999 | Moriyama | |
| 6,081,698 A | 6/2000 | Moriyama | |
| 6,091,941 A | 7/2000 | Moriyama | |
| 7,433,421 B2 * | 10/2008 | Shako et al. | 375/296 |
| 7,447,274 B2 * | 11/2008 | Shako et al. | 375/296 |
| 7,466,762 B2 * | 12/2008 | Shako et al. | 375/296 |
| 7,486,744 B2 * | 2/2009 | Shako et al. | 375/296 |
| 7,613,251 B2 * | 11/2009 | Shako et al. | 375/296 |
| 2004/0246891 A1 * | 12/2004 | Kay et al. | 370/215 |

(Continued)

FOREIGN PATENT DOCUMENTS

JP 04301950 10/1992

(Continued)

OTHER PUBLICATIONS

International Search Report dated May 29, 2007 in corresponding PCT/JP2007/056664.

*Primary Examiner*—Tesfaldet Bocure
(74) *Attorney, Agent, or Firm*—Fujitsu Patent Center

(57) ABSTRACT

A distortion correction control apparatus is for compensating for a burst distortion of a transmission amplifier caused by a burst of an input signal of a transmission target. The apparatus includes a generation unit that generates a distortion correction coefficient having reverse characteristics to the foregoing burst distortion; a unit that multiplies the distortion correction coefficient output from the generation unit by the input signal or adds the distortion correction coefficient output from the generation unit to the input signal, upon reception of burst information notifying of switching between presence and absence of the input signal; and an update unit that updates, based on the input signal and a branch signal fed back as an output signal of the transmission amplifier, parameters of functions used for adaptively generating the distortion correction coefficient, and that inputs the updated parameters to the generation unit.

11 Claims, 16 Drawing Sheets

U.S. PATENT DOCUMENTS

2005/0104758 A1 5/2005 Funya
2006/0215783 A1* 9/2006 Shako et al. ................ 375/296

FOREIGN PATENT DOCUMENTS

| | | |
|---|---|---|
| JP | 09153849 | 6/1997 |
| JP | 20047244 | 1/2004 |
| JP | 2004112252 | 4/2004 |
| JP | 2004187218 | 7/2004 |
| JP | 3560398 | 9/2004 |
| JP | 2005151119 | 6/2005 |
| JP | 2005269043 | 9/2005 |

* cited by examiner

DISTORTION CORRECTION CONTROL APPARATUS AND DISTORTION CORRECTION CONTROL METHOD

CROSS-REFERENCE TO RELATED APPLICATION

This is a continuation of application PCT/JP2007/056664, filed on Mar. 28, 2007, now pending, the contents of which are herein wholly incorporated by reference.

FIELD

The disclosures made herein relate to a distortion correction control apparatus and a distortion correction control method which are to be applied to a wireless communication system.

BACKGROUND

In a wireless communication system that employs a wireless transmission system such as orthogonal frequency division multiplexing (OFDM), signals of burst characteristics are often processed.

In general, an amplifier has amplifier operation points set to AB to B grades to improve power efficiency. Thus, the amount of current flowing to the amplifier during a no-signal period (during a burst-OFF period) is small. When a signal is suddenly input (burst ON) from the burst-OFF period, a current rapidly flows to an amplifier power source system. The power source system cannot follow such a sudden change in current value, causing current and voltage waveforms to exhibit transient responses (refer to FIG. 1). As a result, amplifier characteristics change.

As a related art of the present invention, techniques disclosed in the following two Patent Documents may be cited. First, Japanese Patent Application Laid-Open No. 2004-112252 (Patent Document 1) discloses a technique of adjusting an amplifier input signal to correct an amplifier distortion caused by burst transmission. This technique is characterized by measuring leading and trailing of a burst signal during transmission and performing a burst correction operation according to the leading and trailing thus measured.

Second, Japanese Patent Application Laid-Open No. H04-301950 (Patent Document 2) discloses a technique of restraining sudden rising to suppress burst distortion. This technique is characterized by suppressing the occurrence of burst distortion itself via ramp processing to gradually increase transmission outputs.

According to the technique described in Patent Document 1, a built-in correction coefficient is used, which does not follow the changes in amplifier characteristics. Because the amplifier undergoes changes in its characteristics due to a temperature or a passage of time, the amplifier has to maintain correction accuracy of burst distortion by adaptively updating the correction coefficient.

According to the technique described in Patent Document 2, a ramp operation is performed, which suppresses sudden rising of a transmission signal to gradually increase outputs. In this technique, a signal rising period has to be provided before burst-ON or a signal has to be gradually raised after burst-ON, which causes deformation of a waveform of an amplifier output signal.

The following are related arts to the invention.

[Patent document 1] Japanese Patent Laid-Open Publication No. JP 2004-112252

[Patent document 2] Japanese Patent Laid-Open Publication No. JP H04-301950

[Patent document 3] Japanese Patent Laid-Open Publication No. JP H09-153849

[Patent document 4] Japanese Patent No. JP 3560398

SUMMARY

According to an aspect of the disclosures made herein, a distortion correction control apparatus is for compensating for a burst distortion of a transmission amplifier caused by a burst of an input signal of a transmission target. The apparatus includes a generation unit that generates a distortion correction coefficient having reverse characteristics to the foregoing burst distortion; a unit that multiplies the distortion correction coefficient output from the generation unit by the input signal or adds the distortion correction coefficient output from the generation unit to the input signal, upon reception of burst information notifying of switching between presence and absence of the input signal; and an update unit that updates, based on the input signal and a branch signal fed back as an output signal of the transmission amplifier, parameters of functions used for adaptively generating the distortion correction coefficient, and that inputs the updated parameters to the generation unit.

The objects and advantages of the invention will be realized and attained by means of the elements and combinations particularly pointed out in the claims.

DESCRIPTION OF EMBODIMENTS

Figure 1:
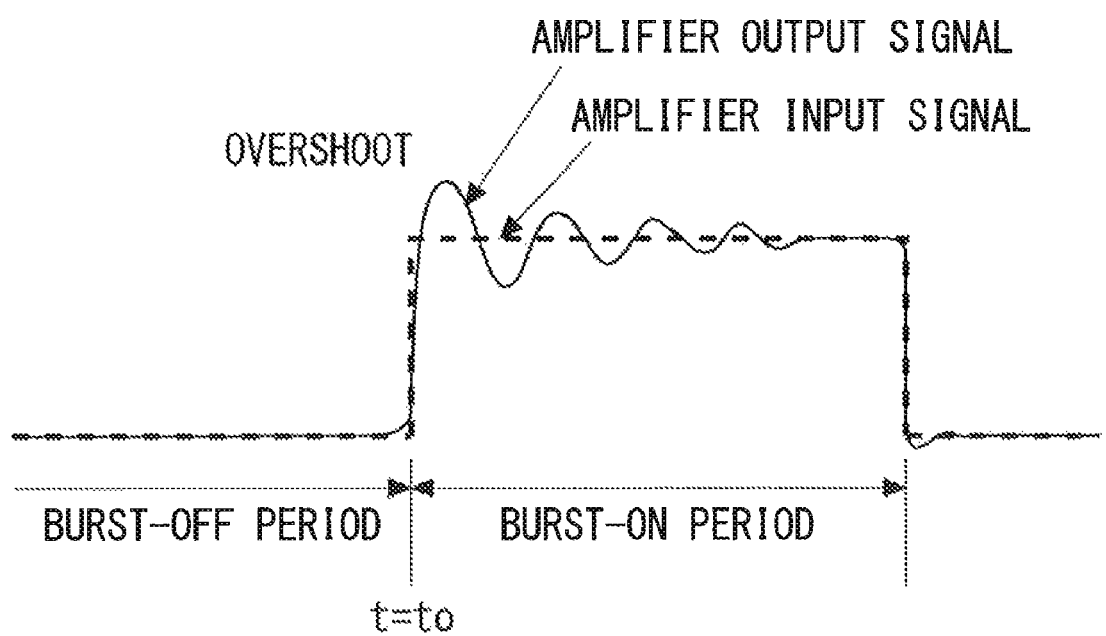
FIG. 1 is a diagram illustrating input and output signals in a transmission amplifier during burst transmission.

The embodiments of the disclosures made herein will be described below referring to the drawings in detail. The drawings illustrate preferred embodiments. It should be understood, however, that the embodiments can be implemented by many different embodiments, and are not limited to the embodiments described herein.

First Embodiment

Figure 2:
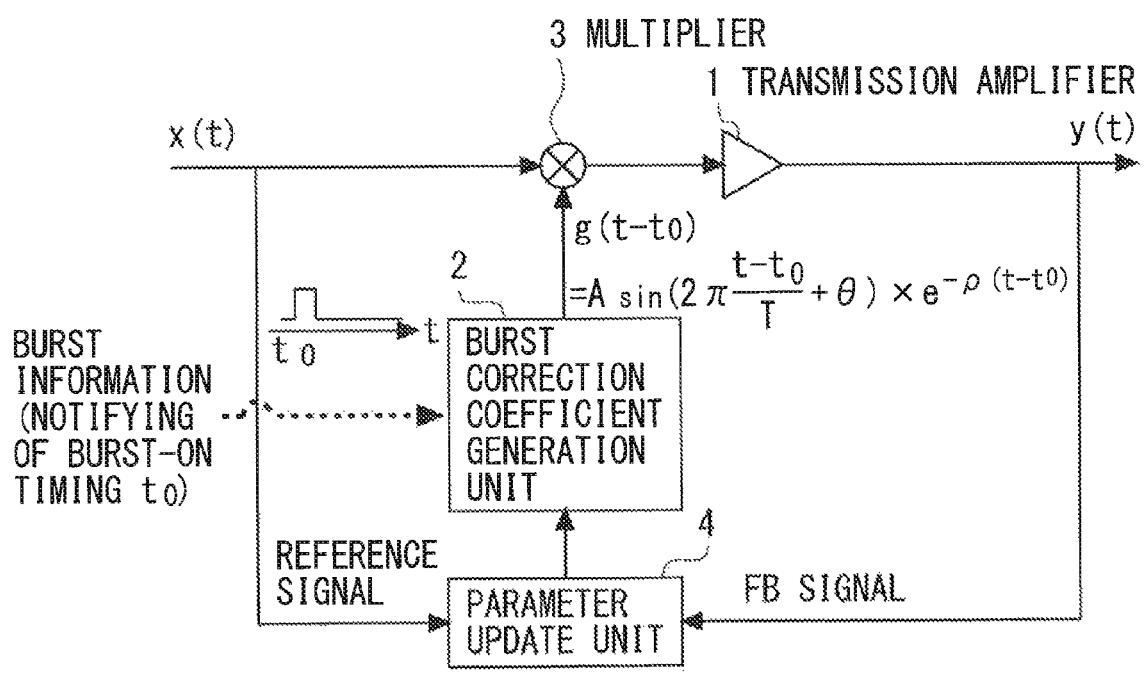
FIG. 2 is a block diagram illustrating a burst distortion correction control apparatus according to a first embodiment of the present invention.

Referring to FIG. 2 illustrating a configuration (basic configuration) of a first embodiment of the present invention, a burst distortion correction control apparatus employs, to correct an amplifier distortion (burst distortion) caused by burst characteristics of an input signal (baseband signal) x(t) of a transmission target, a configuration in which the input signal x(t) to a transmission amplifier (RF amplifier) 1 is multiplied by (or may be added to) a correction coefficient.

The correction coefficient (burst distortion correction coefficient) is generated to be output by a burst correction coefficient generation unit 2 by using burst information that is a signal (signal notifying of timing of burst (start) ON) notifying of switching between presence and absence of an input signal as a reference (opportunity), and the input signal x(t) is multiplied by the burst information as reverse characteristics to the burst distortion by a multiplier 3. The burst distortion correction coefficient is generated by using a function in the burst correction coefficient generation unit 2.

A parameter update unit 4 updates parameters of the functions for adaptively generating a burst distortion correction coefficient based on the input signal x(t) and a branch signal y(t) as reference signals. The branch signal (FB signal) y(t) is a signal obtained as partial feedback of the output signal y(t) from the transmission amplifier 1, and is equivalent to the output signal y(t).

More specifically, the burst distortion correction coefficient is generated, in the burst correction coefficient generation unit 2, by two components of vibration and attenuation. For example, when a sine function is substituted for the vibration function and an exp function (exponential function) is substituted for the attenuation function, a burst distortion correction coefficient may be represented by the following expression 1.

$$g(t-t_0) = A\sin\left(2\pi\frac{t-t_0}{T} + \theta\right)e^{-\rho(t-t_0)} \quad \text{[Expression 1]}$$

In the expression 1, A, T, θ, and θ are parameters of sine and exponential functions to adaptively generate a burst distortion correction coefficient. A, T, and θ respectively denote an amplitude, a cycle, and an initial phase of the sine function, and ρ denotes an attenuation amount of the exponential function (e). The burst distortion correction coefficient output from the burst correction coefficient generation unit 2, which is multiplied by or added to the input signal x(t) of a transmission target, is a correction coefficient based on a passage of time from switching between presence and absence of an input signal.

Figure 3:
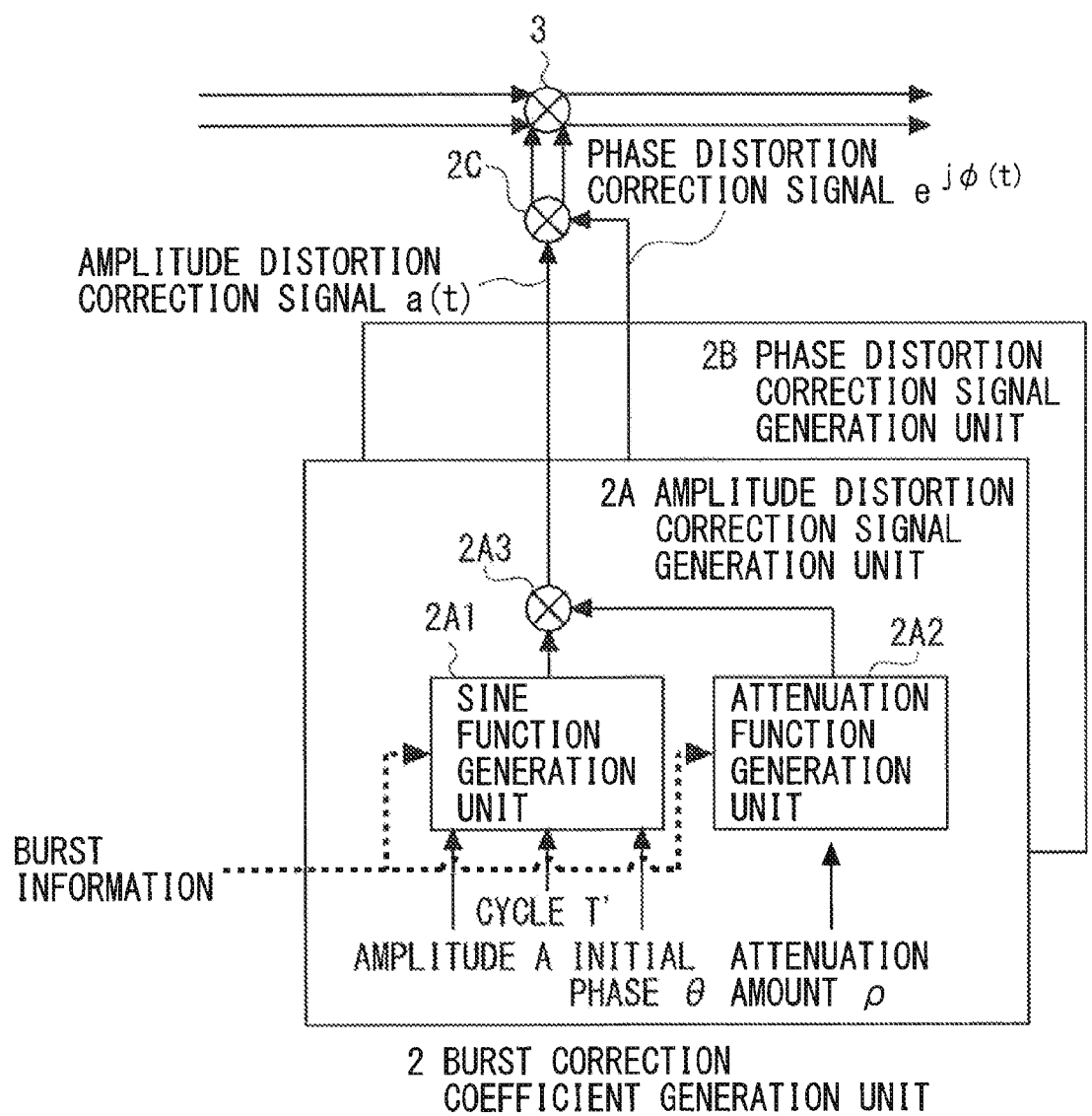
FIG. 3 is a block diagram illustrating a configuration example of the burst correction coefficient generation unit of FIG. 2.

When the parameters described above are used for burst distortion correction, the burst correction coefficient generation unit 2 may employ a configuration shown in FIG. 3. As shown in FIG. 3, the burst correction coefficient generation unit 2 includes an amplitude distortion correction signal generation unit 2A and a phase distortion correction signal generation unit 2B, and updated parameters A, T, θ, and ρ are input from the parameter update unit 4.

The amplitude distortion correction signal generation unit 2A and the phase distortion correction signal generation unit 2B each include a sine function generation unit 2A1, an exponential function generation unit 2A2, and a multiplier 2A3. In the amplitude distortion correction signal generation unit 2A, sine and exponential functions multiplied by the multiplier 2A3 are output as an amplitude distortion correction signal a(t) of the burst distortion, to a multiplier 2C. In the phase distortion correction signal generation unit 2B, sine and exponential functions multiplied by the multiplier 2A3 are output as a phase distortion correction signal $e^{j\Phi(t)}$ of the burst distortion, to the multiplier 2C. The amplitude distortion correction signal a(t) of burst distortion and the phase distortion correction signal $e^{j\Phi(t)}$ of the burst distortion are input to the multiplier 3.

The burst distortion correction control apparatus shown in FIG. 2 executes digital signal processing, and therefore includes a digital/analog (D/A) converter disposed on an input side (front stage) to the transmission amplifier 1 and an analog/digital (A/D) converter disposed on a reception line (rear stage) of a branch signal y (t) of an output side of the transmission amplifier 1. However, these components are not shown. Unless specified otherwise, drawings of these components are omitted in the other embodiments.

In the front and rear stages of the transmission amplifier 1, a quadrature modulator, a quadrature demodulator, and a local oscillator are disposed. However, drawings of these components are omitted for simpler description.

Next, two types of methods that enable the burst correction coefficient generation unit 2 to obtain burst information as a signal notifying of burst-ON timing will be described.

Figure 4A:
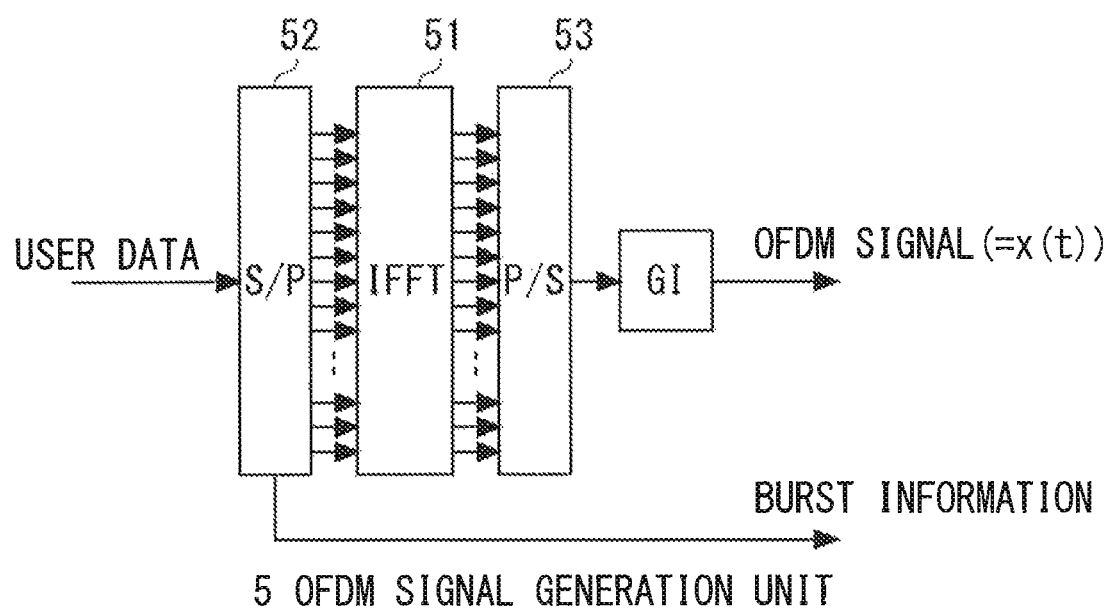
FIG. 4A illustrates a first method of obtaining burst information.

The first one of the methods includes a method of snooping burst information from an OFDM signal generation unit 5 shown in FIG. 4A. An OFDM signal is generated on a block unit basis using inverse fast Fourier transform (IFFT). A burst occurs in a processing unit of this IFFT. Burst information is obtained by checking whether an input signal to an IFFT processing unit 51 has switched from all"0" to burst-ON, and whether a signal after IFFT processing has switched from all"0" to burst-ON.

Whether the input signal to the IFFT processing unit 51 has switched from all "0" to burst-ON is determined by a serial/parallel (S/P) converter 52 to obtain burst information. This determination may be performed based on an output signal from the IFFT processing unit 51 to obtain burst information.

Figure 4B:
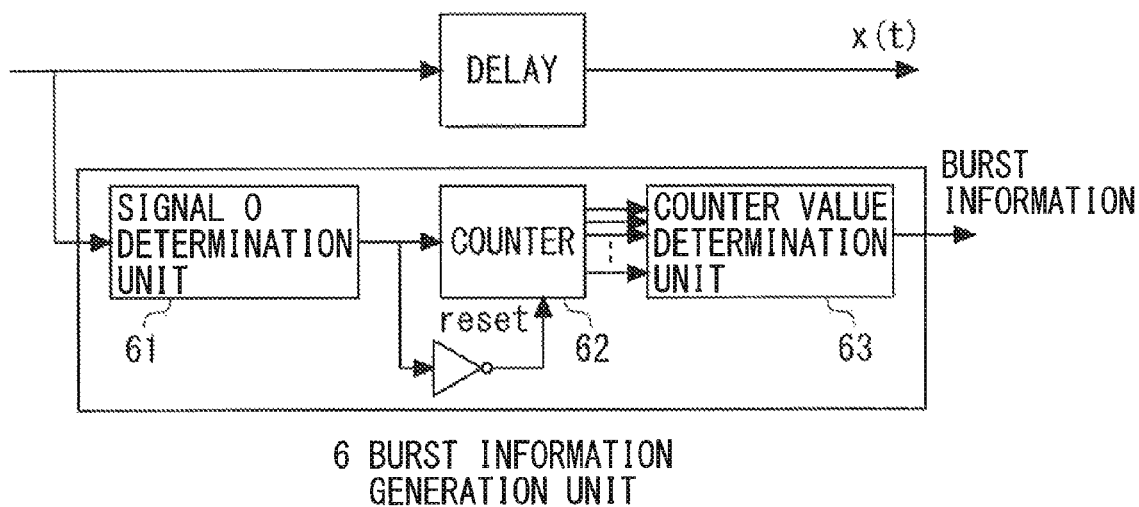
FIG. 4B illustrates a second method of obtaining burst information.

The second one of the methods includes a method of automatically determining whether an input signal x(t) of a transmission target is predetermined time zero and using the input signal x(t) as burst information. FIG. 4B illustrates a specific example of independently generating burst information.

In a burst information generation unit 6, a signal zero determination unit 61 determines whether the input signal x(t) is a zero (0) signal. If the signal is a zero signal, a counter 62 of a rear stage is reset. If the signal is not a zero signal, the counter 62 is counted up.

In a counter value determination unit 63, if a counter value has reached a predetermined value, a pulse of burst information is generated determining that a burst-ON period has been started. In the drawing, there is provided a delay circuit (Delay) for delaying the input signal x(t) by processing time in the burst information generation unit 6.

Figure 5:
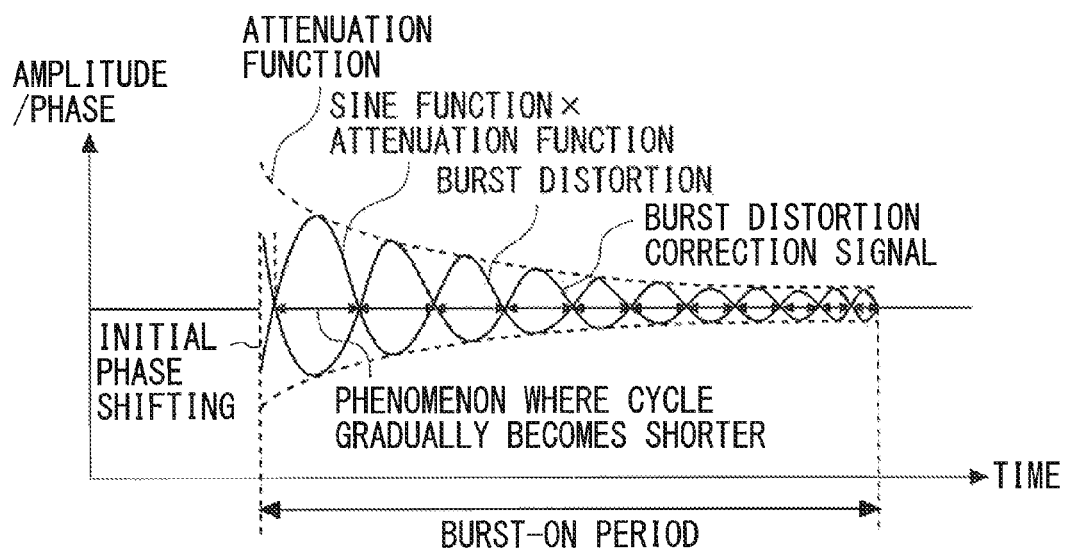
FIG. 5 is a graph illustrating a relationship between burst distortion and a burst distortion correction coefficient in the transmission amplifier.

FIG. 5 illustrates a relationship between a status of a burst distortion caused by a burst signal in the transmission amplifier 1 and a burst distortion correction coefficient (correction signal). The burst distortion is a distortion changed as amplitude distortion and phase distortion with a passage of time from burst-ON and gradually converged with time. The burst distortion correction coefficient that is reverse in characteristics is obtained by function approximation. In this case, a method of generating a burst distortion coercion coefficient by using a sine function and an attenuation function (exponential function) is employed as one method. As for the sine function, gradually making a cycle shorter with a passage of time from burst-ON enables more accurate approximation.

Figure 6:
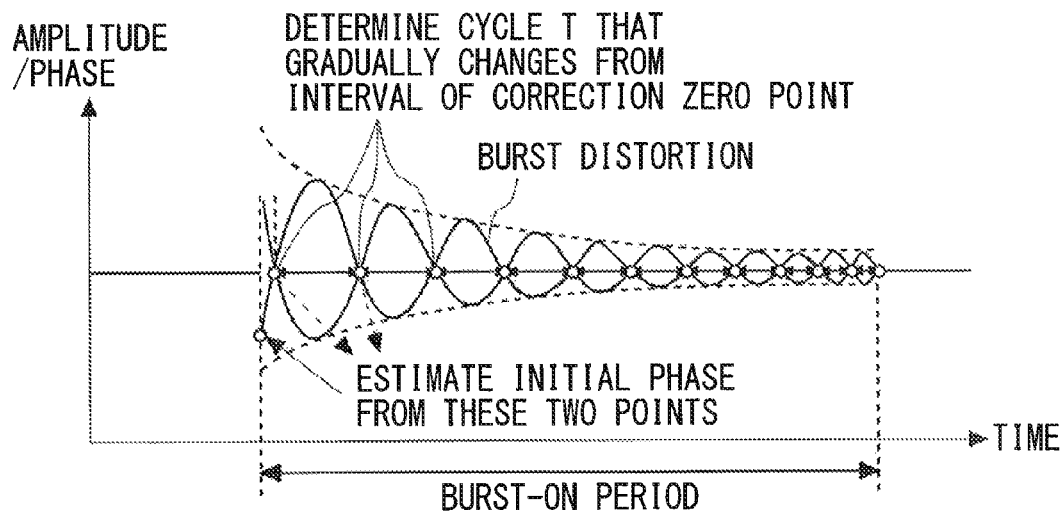
FIG. 6 is a graph illustrating estimation of a cycle and an initial phase of a sine function.

FIG. 6 illustrates an example of determining a cycle T and an initial phase θ of the sine function. The parameter update unit 4 captures timing (time/interval) at which the burst distortion becomes zero in a burst-ON section to determine (estimate) a cycle T and an initial phase θ.

Second Embodiment

Figure 7:
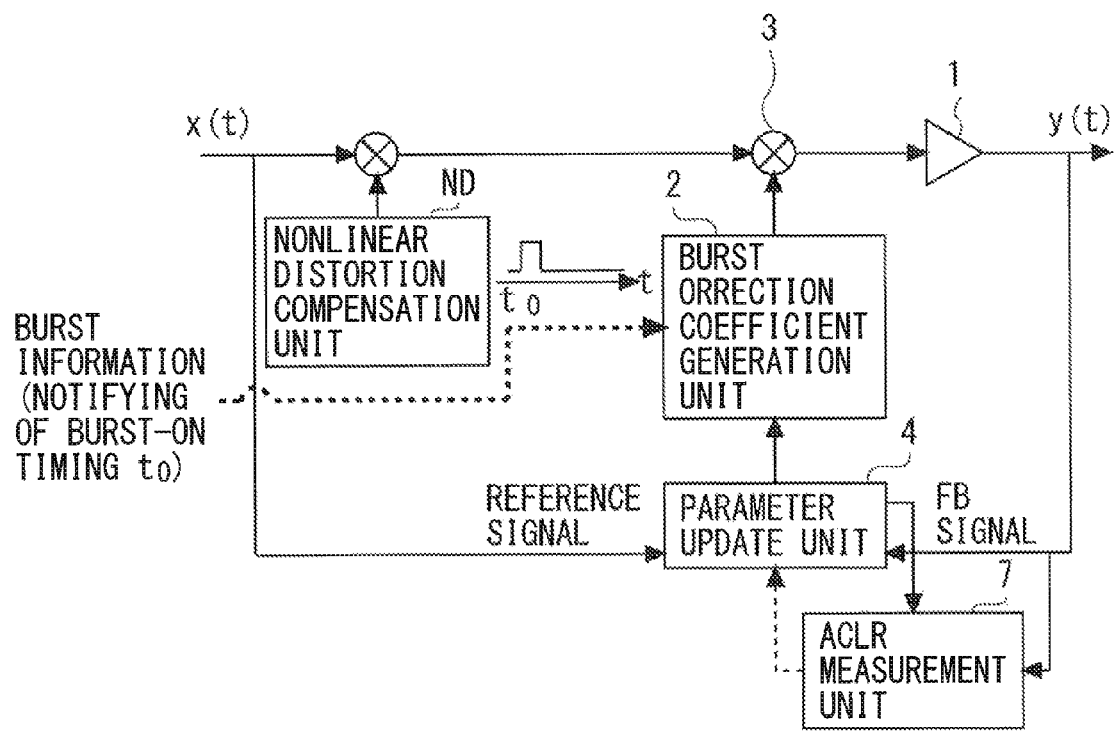
FIG. 7 is a block diagram illustrating a burst distortion correction control apparatus according to a second embodiment of the present invention.

FIG. 7 illustrates a configuration of a burst distortion correction control apparatus according to a second embodiment of the present invention. The second embodiment is a modified example of the basic configuration of the first embodiment shown in FIG. 2.

Referring to FIG. 7, the burst distortion correction control apparatus includes a burst correction coefficient generation unit 2, a multiplier 3, a parameter update unit 4, and an adjacent channel leakage power ratio (ACLR) measurement unit 7.

In the burst distortion correction control apparatus, parameters are determined by ACLR measurement. Thus, an ACLR of a branch signal (FB signal) y(t) obtained by feeding back a part of an output signal y(t) from a transmission amplifier is calculated to determine parameters for function approximation.

The ACLR measurement unit 7 performs frequency analysis for the branch signal y(t) to measure leakage power of a frequency adjacent to an input signal x(t). For this frequency analysis, fast Fourier transform (FFT), which is digital signal processing, is conveniently used.

The ACLR measurement unit 7 captures the branch signal y(t) as input data necessary for FFT analysis according to an ACLR measurement request from the parameter update unit 4. The ACLR measurement unit 7 performs FFT processing for the captured branch signal y(t) to set the processed branch signal y(t) as frequency data, and measures an ACLR. The obtained ACLR is reported to the parameter update unit 4.

Figure 8:
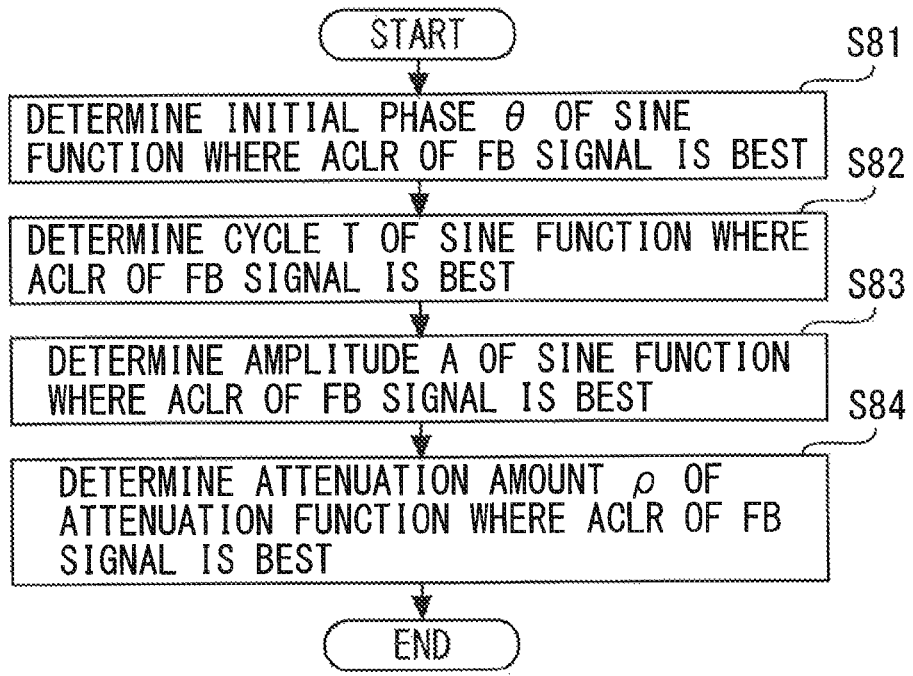
FIG. 8 is a flowchart illustrating a parameter determination procedure based on ACLR.

FIG. 8 illustrates an example of a parameter determination procedure based on ACLR measurement. The ACLR measurement unit 7 determines parameters of a sine function and an attenuation function (exponential function) where an ACLR of the branch signal y(t) is best. The parameters of an initial phase θ, a cycle T, an amplitude A, and an attenuation amount ρ are determined in the stated order (steps S81 to S84). However, order of determining the parameters is not limited to this order.

Figure 9:
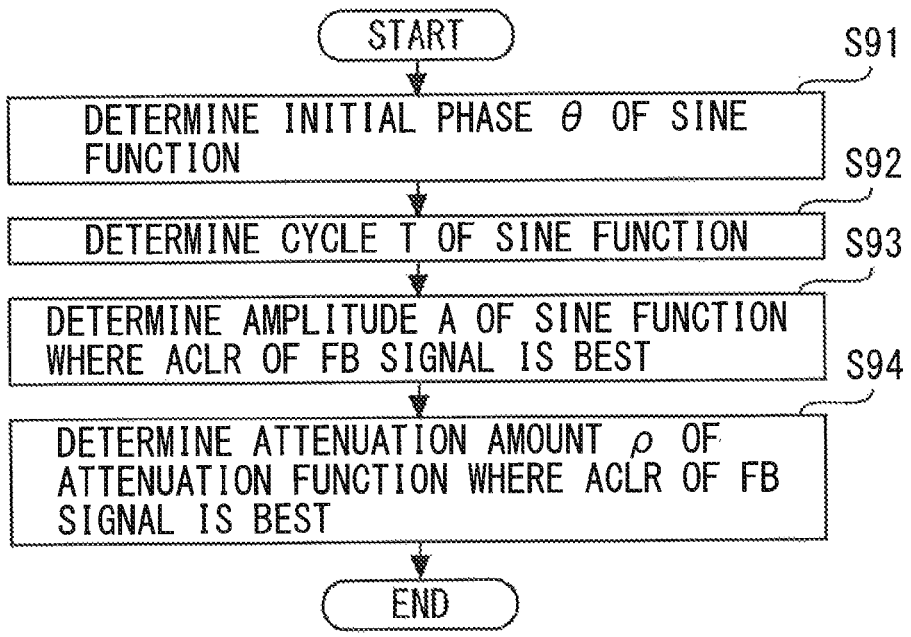
FIG. 9 is a flowchart illustrating a parameter determination procedure based on combination.

FIG. 9 illustrates a parameter determination procedure in which parameter determination by ACLR measurement by the ACLR measurement unit 7 is combined with the method for determining a cycle T and an initial phase θ by the parameter update unit 4 described above referring to FIG. 6. In other words, the parameter update unit 4 captures timing (time/interval) at which the burst distortion becomes zero in a burst-ON section to determine an initial phase θ and a cycle T of the sine function (steps S91 and S92). Then, the ACLR measurement unit 7 determines an amplitude A and an attenuation amount ρ of the sine function by ACLR measurement (step S93 and S94).

Referring back to FIG. 7, the burst distortion correction control apparatus of the second embodiment includes a nonlinear distortion compensation unit ND. The nonlinear distortion compensation unit ND compensates for nonlinear distortion of the transmission amplifier 1 by digital predistortion (DPD). Details on DPD may be easily understood by referring to Patent Document 4, and thus description thereof will be omitted.

Third Embodiment

Figure 10:
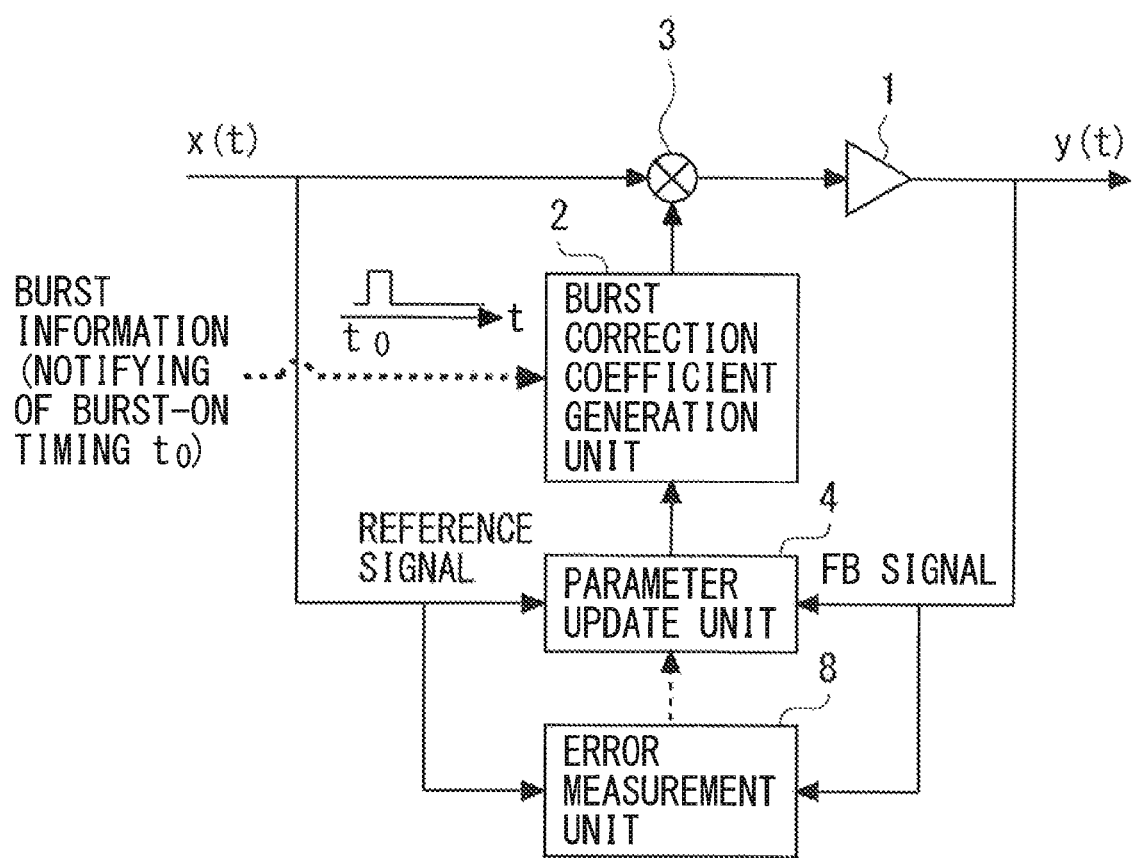
FIG. 10 is a block diagram illustrating a burst distortion correction control apparatus according to a third embodiment of the present invention.

FIG. 10 illustrates a configuration of a burst distortion correction control apparatus according to a third embodiment of the present invention. The third embodiment is another modified example of the basic configuration of the second embodiment shown in FIG. 2.

Referring to FIG. 10, the burst distortion correction control apparatus includes a burst correction coefficient generation unit 2, a multiplier 3, a parameter update unit 4, and an error measurement unit 7.

In the burst distortion correction control apparatus, parameters are determined by error measurement. Thus, an error between an input signal x(t) as a reference signal and a branch signal (FB signal) obtained by feeding back a part of output signal y(t) from a transmission amplifier 1 is obtained, and parameters A, T, θ, and ρ which minimize the error are determined (selected) for function approximation.

Figure 11:
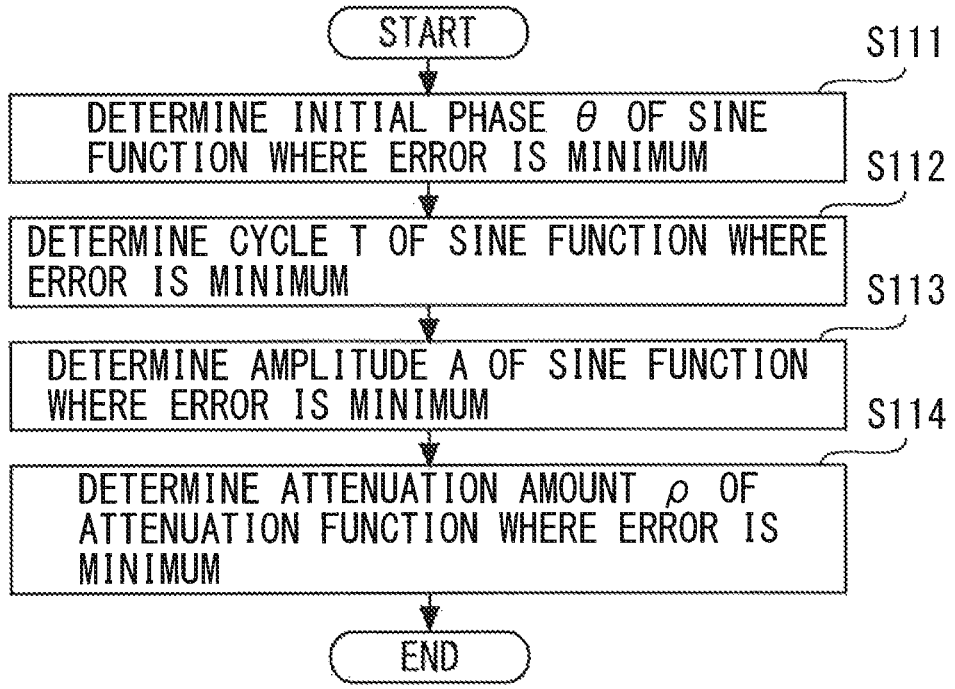
FIG. 11 is a flowchart illustrating a parameter determination procedure based on error.

FIG. 11 illustrates an example of a parameter determination procedure by error measurement. The error measurement unit 8 determines parameters of a sine function and an attenuation function (exponential function) where an error between the input signal x(t) and the branch signal y(t) is minimum. The parameters of an initial phase θ, a cycle T, an amplitude A, and an attenuation amount ρ are determined in the stated order (steps S111 to S114). However, the order of determining parameters is not limited to this.

The error measurement unit 8 may employ a method of executing sequential processing to determine optimal parameters. A method of determining an initial phase θ of a sine function will be described as an example.

Figure 12:
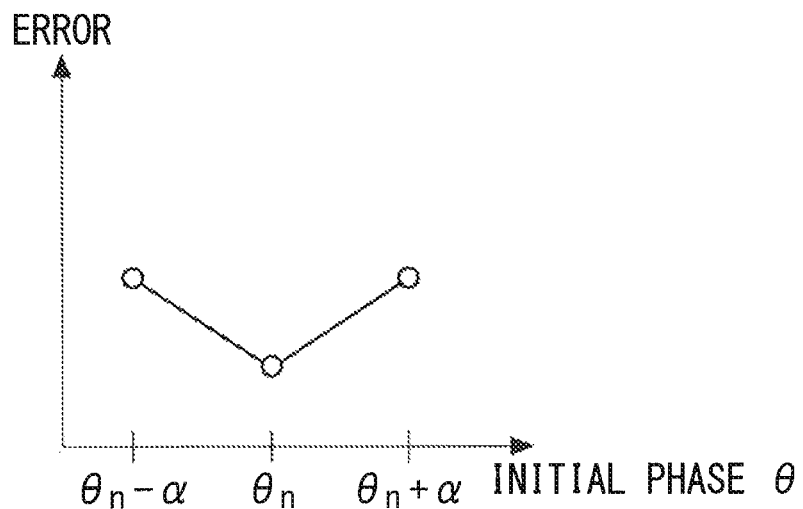
FIG. 12 is a graph for illustrating a parameter determination procedure based on error.

First, the error measurement unit 8 performs error measurement based on a currently set initial phase $\theta_n$. The error measurement unit 8 sets the initial phase $\theta_n$ to an initial phase $\theta_{n+\alpha}$ and an initial phase $\theta_{n-\alpha}$, obtained by shifting the initial phase by a small amount α, and measures again an error therebetween. As shown in FIG. 12, if an error is minimum at the initial phase $\theta_n$, $\theta_n$ is determined to be an optimal initial phase to finish the processing.

Figure 13:
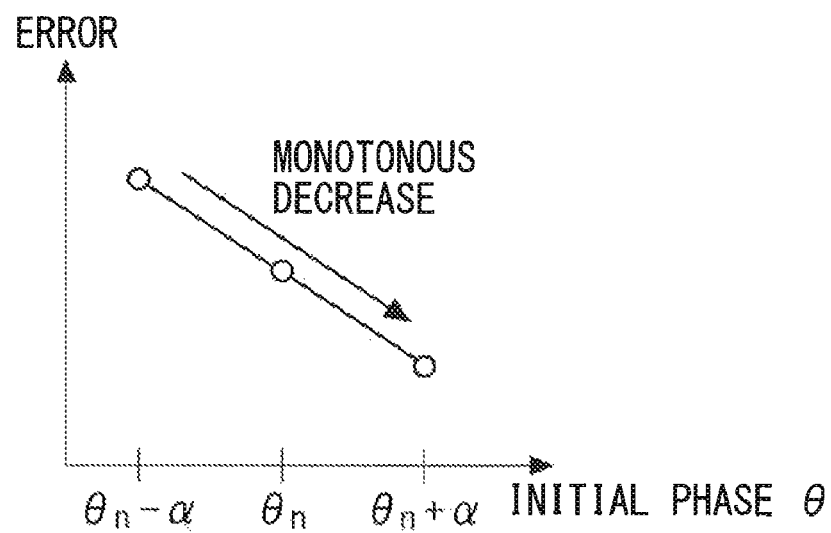
FIG. 13 is a graph for illustrating a parameter determination procedure based on error.

If the initial phase $\theta_n$ is not optimal, errors obtained at three initial phases exhibit monotonous decreases or increases. FIG. 13 illustrates an example where an error is smaller as an initial phase θ is larger. In this case, replacement of $\theta_n = \theta_{n+\alpha}$, is set to measure errors at the three points again, thereby searching for an optimal initial phase.

Figure 14:
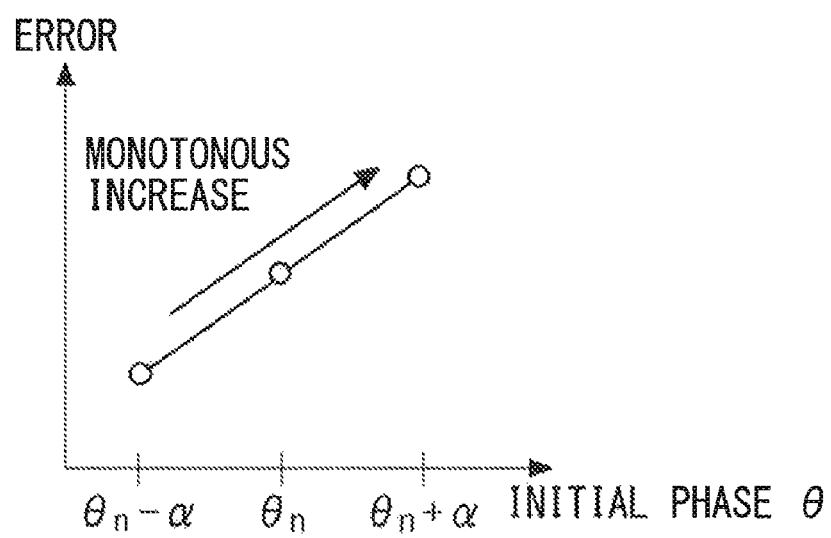
FIG. 14 is a graph for illustrating a parameter determination procedure based on error.

FIG. 14 illustrates an example where an error is larger as an initial phase θ is larger. In this case, replacement of $\theta_n = \theta_{n-\alpha}$ is set to measure errors at the three points again to search for an optimal initial phase.

Fourth Embodiment

Figure 15:
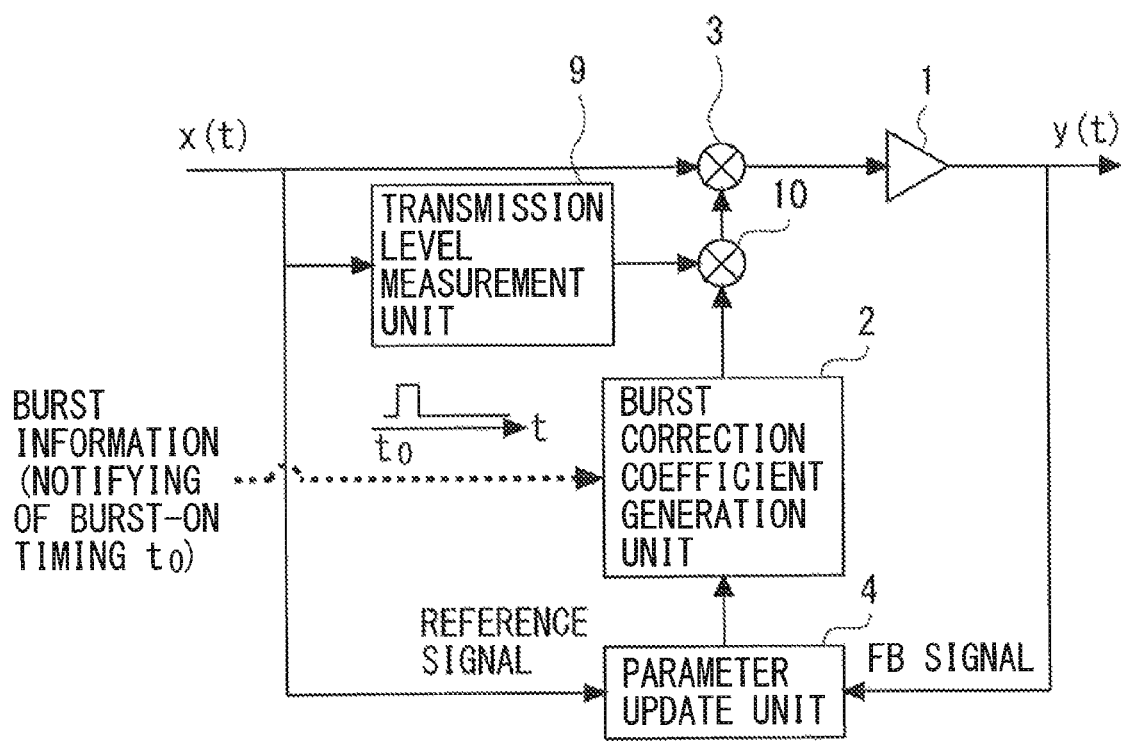
FIG. 15 is a block diagram illustrating a burst distortion correction control apparatus according to a fourth embodiment of the present invention.

FIG. 15 illustrates a configuration of a burst distortion correction control apparatus according to a fourth embodiment of the present invention. The fourth embodiment is further another modified example of the basic configuration of the first embodiment shown in FIG. 2.

The burst distortion correction control apparatus of the fourth embodiment employs a configuration where the burst distortion correction coefficient generated in the basic configuration of the first embodiment described above is adjusted according to an average size (amplitude) of input signals x(t) of transmission targets. Thus, the burst distortion correction control apparatus further includes a transmission level measurement unit 9 for obtaining an average size of input signals x(t).

Specifically, the transmission level measurement unit 8 obtains an average power of the input signals x(t). A burst distortion correction coefficient is output from a burst correction coefficient generation unit 2 upon reception of a signal (burst signal) notifying of burst-ON timing. The burst distortion correction coefficient thus output is multiplied by the average power obtained by the transmission level measurement unit 9, via a multiplier 10. A result of this multiplying is multiplied as reverse characteristics of burst distortion by the input signal x(t), by a multiplier 3.

Accordingly, as in the case of the burst distortion correction control apparatus of the first embodiment, adjustment (control) is performed to prevent a change in size of a burst correction coefficient following an instantaneous change (for each sampling point).

Other components and an operation of the burst distortion correction control apparatus of the fourth embodiment are similar to those of the burst distortion correction control apparatus of the first embodiment described above.

Figure 16:
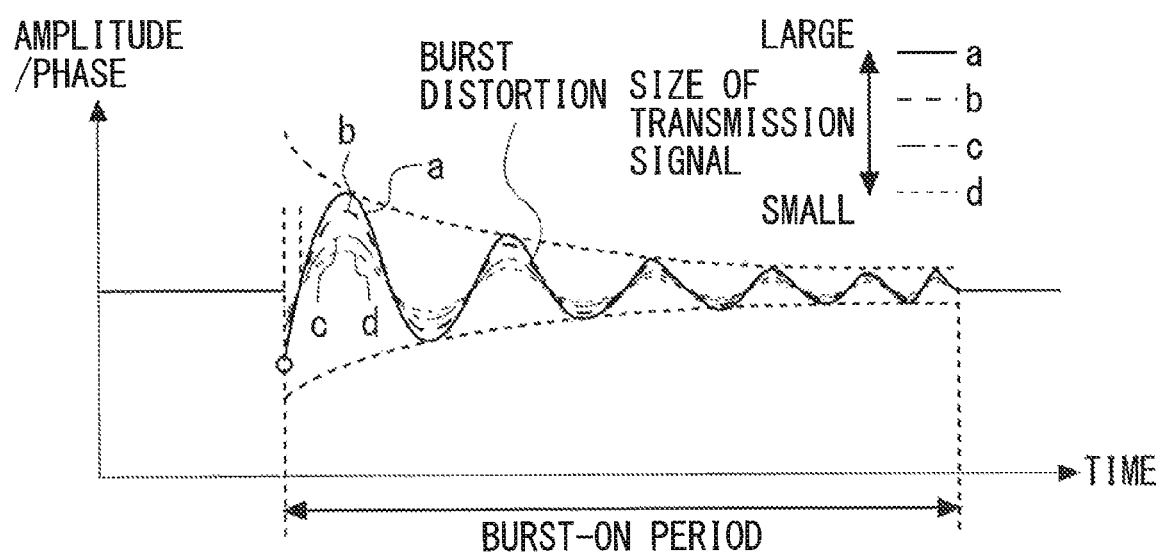
FIG. 16 is a graph illustrating burst distortion that changes in accordance with a size of an input signal.

FIG. 16 illustrates a status of a change in a burst distortion made according to a size of the input signal x(t) of a transmission target. As apparent from FIG. 16, burst distortion during burst transmission is larger when an input signal x(t) is larger.

Fifth Embodiment

Figure 17:
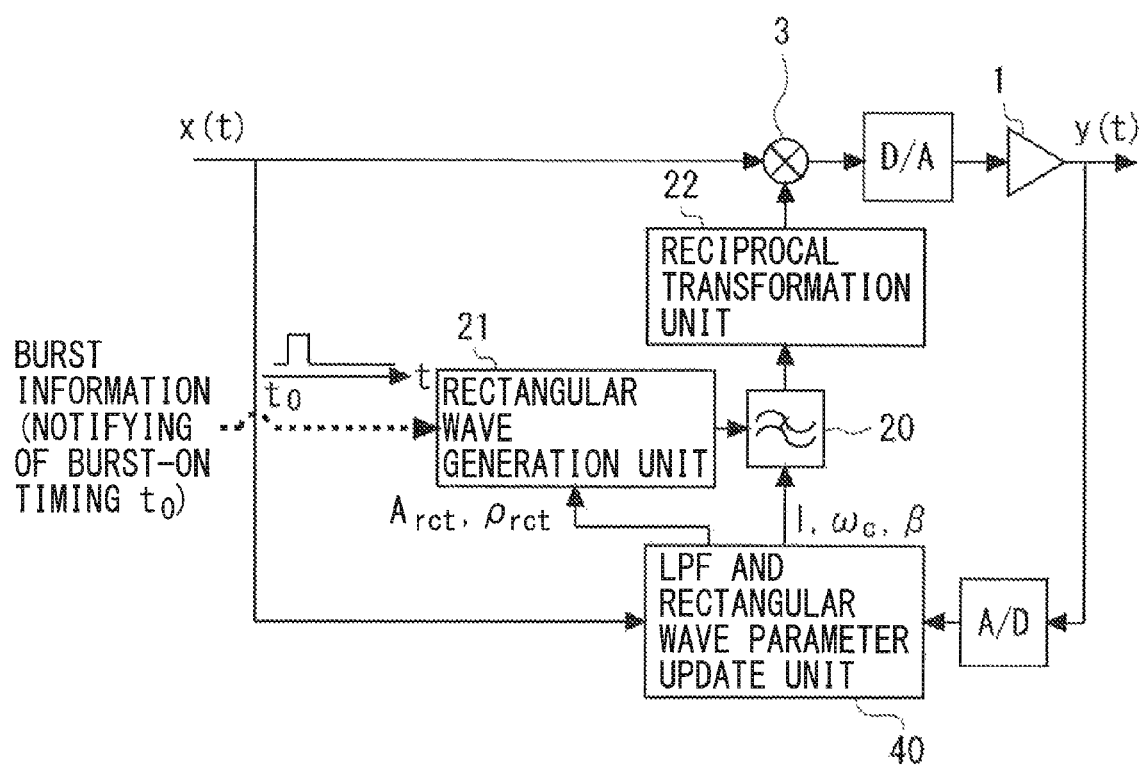
FIG. 17 is a block diagram illustrating a burst distortion correction control apparatus according to a fifth embodiment of the present invention.
Figure 18:
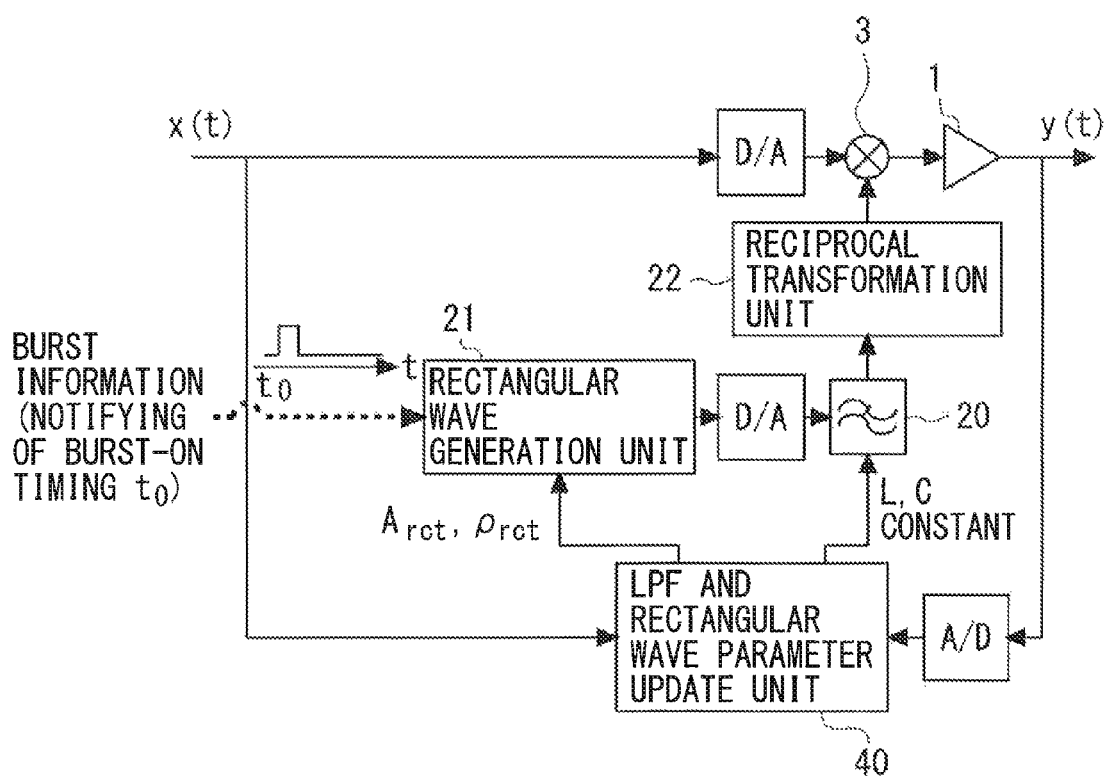
FIG. 18 is a block diagram illustrating the burst distortion correction control apparatus according to the fifth embodiment of the present invention.

FIGS. 17 and 18 each illustrate a configuration of a burst distortion correction control apparatus according to a fifth embodiment of the present invention. The fifth embodiment is still further another modified example of the basic configuration of the first embodiment shown in FIG. 2.

Each of the burst distortion correction control apparatuses of the fifth embodiment employs a configuration where a burst distortion correction coefficient is generated by a burst correction coefficient generation unit 2 using a low-pass filter (LPF) 20, and parameters of functions for adaptively generating a burst distortion correction coefficient are updated by a parameter update unit 4 (LPF and rectangular wave parameter update unit 40).

The burst correction coefficient generation unit 2 includes a rectangular wave generation unit 21 to use approximation of a waveform of burst distortion by a response of the LPF 20 to a rectangular wave. The parameter update unit 40 adjusts a burst distortion correction coefficient by using a shape, an order, and a cut-off frequency of the LPF 20 as parameters. The parameter update unit 40 reproduces, based on the fact that a burst distortion becomes gradually smaller with a passage of time, the burst distortion by gradually reducing a rectangular wave generated by the rectangular wave generation unit 21.

In the case of correcting a burst distortion by a digital filter, there are roughly two filter designing methods, including a method based on finite-duration impulse response (FIR) and a method based on infinite-duration impulse response (IIR). In this embodiment, there is employed a designing method using a FIR filter of high operation stability, and a description is given thereof.

When burst distortion correction is controlled by using the FIR filter as the LPF 20, totally five types of parameters may be employed. Regarding the FIR filter itself, there are three types including a tap length 1, a cut-off frequency $\omega_c$, and a window function (Kaiser window) parameter β. As rectangular wave generation parameters input to the filter, there are two types including an amplitude $A_{rct}$ and an attenuation amount $\rho_{rct}$ of a rectangular wave. For a method for adjusting these parameters, the method based on the ACLR measurement or the method based on the error measurement may be employed.

In the case of designing the LPF (FIR filter) 20 by a limited tap length, a tap coefficient $tap_k$ is obtained by the following expression 2.

$$tap_k = \frac{\omega_c T \sin(k-l)\omega_c T}{\pi(k-l)\omega_c T}, \quad k = 0, 1, \ldots , \qquad [\text{Expression 2}]$$

In the expression, 1 denotes a tap length, T denotes a sampling frequency, and $\omega_c$ denotes a cut-off frequency.

In the LPF of the limited tap length, multiplying the tap coefficient $tap_k$ by a window function enables adjustment of attenuation amounts of a passband ripple, a transfer band, and a block band. There are various window functions including Humming widow, Han window, Blackman window, and Kaiser window. Changing a type of a window function enables adjustment of a burst distortion correction coefficient. However, when Kaiser window having a variable adjust parameter β is employed, an optional window function may be generated by adjusting the parameter β. Thus, adjustment of the burst distortion correction coefficient is easy.

On the other hand, when an analog filter is used as the LPF 20, the parameter update unit 40 may adjust the burst distortion correction coefficient by changing a filter shape, an order, and constants L and C of the LC circuit.

Analog filter shapes include Butterworth type, Chebychev type, Gausssian type, and Vessel type, which are selectively used according to the characteristics of burst distortion. When correcting a phase distortion of a burst distortion, the filters excluding Vessel type where group delay characteristics in a band are flat may be employed.

Orders may also be selectively used according to the characteristics of burst distortion. For example, adjustment is made by employing a filter of a small order when the burst distortion is great, and a filer of a large order when the burst distortion is great.

To adjust the burst distortion correction coefficient based on adaptive control, constants L and C of the LC circuit may be changed. The constants L and C may be changed by employing an element that may vary constants of a used coil L and a used capacitor C. When the parameter update unit 40 changes the L and C constants, a cut-off frequency and a block band attenuation amount of the LPF 20 are adjusted, with the result that the burst distortion correction coefficient is adjusted. For a parameter adjustment method, the method based on the ACLR measurement or the method based on the error measurement described above may be employed.

Figure 19:
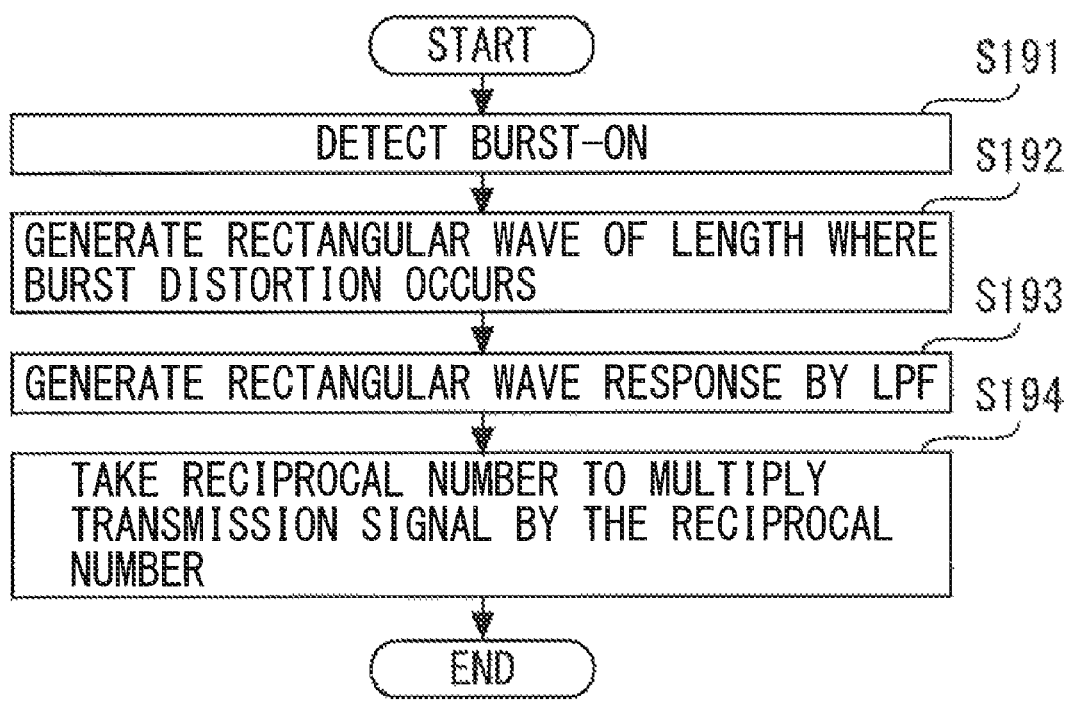
FIG. 19 is a flowchart illustrating a generation procedure of a burst distortion correction coefficient using LPF.

FIG. 19 illustrates a generation procedure of a burst distortion correction coefficient using the LPF 20 in the burst distortion correction control apparatus that employs a configuration shown in FIGS. 17 and 18. First, the rectangular wave generation unit 21 detects burst-ON based on burst information notifying of switching between presence and absence of an input signal, and generates a rectangular wave corresponding to a length (time) generated by the burst distortion. The LPF 20 that has received the rectangular wave from the rectangular wave generation unit 21 generates and outputs a response to the rectangular wave. A reciprocal transformation unit 22 takes a number reciprocal to this response to multiply an input signal x(t) of a transmission target by the number by a multiplier 3.

Effects of Embodiments

According to the burst distortion correction control apparatus of each embodiment, in the transmission amplifier 1 where nonlinear distortion occurs, an adjacent channel leakage power ratio (ACLR) deteriorated by the influence of the burst distortion generated when a signal is burst-transmitted may be rectified.

According to the burst distortion correction control apparatus of each embodiment, to correct an amplifier distortion (burst distortion) caused by burst transmission, reverse characteristics are given to an input signal to correct the distortion, a correction coefficient is generated by a function, and parameters are adaptively updated. Thus, an optimal correction coefficient may be maintained even when amplifier characteristics undergo change due to a temperature or a passage of time/years.

According to the burst distortion correction control apparatus of each embodiment, a burst distortion may be corrected without deforming a waveform of an amplifier output signal by ramp processing or the like.

Modification Example

The burst distortion correction of each embodiment may be applied to any situation such as when power is supplied, where the presence and absence of an input signal is switched. A burst distortion correction coefficient may be generated highly accurately and fast by using an adjustment rectangular wave signal as an input signal.

The processing of each embodiment described above is provided as a computer-executable program, and may be provided via a recording medium such as a CD-ROM or a flexible disk, and via a communication line.

A plurality of optional processing operations or all of the embodiments may be selectively combined to be implemented.

What is claimed is:

1. A distortion correction control apparatus for compensating for burst distortion of a transmission amplifier caused by a burst of an input signal of a transmission target, comprising:
   a generation unit that generates a distortion correction coefficient having reverse characteristics to the burst distortion;
   a unit that multiplies the distortion correction coefficient output from the generation unit by the input signal or adds the distortion correction coefficient output from the generation unit to the input signal, upon reception of burst information notifying of switching between presence and absence of the input signal; and
   an update unit that updates, based on the input signal and a branch signal fed back as an output signal of the transmission amplifier, parameters of functions used for adaptively generating the distortion correction coefficient, and that inputs the updated parameters to the generation unit.

2. The distortion correction control apparatus according to claim 1, wherein the functions for adaptively generating the distortion correction coefficient are a sine function and an exponential function.

3. The distortion correction control apparatus according to claim 2, wherein the sine function includes, as parameters thereof, an amplitude, a cycle, and an initial phase, and the exponential function includes, as parameters thereof, attenuation amounts.

4. The distortion correction control apparatus according to claim 3, wherein the update unit determines the cycle of the parameters of the sine function based on time and an interval when the burst distortion becomes zero in a burst continuance section.

5. The distortion correction control apparatus according to claim 3, wherein the update unit determines the initial phase of the parameters of the sine function based on time and an interval when the burst distortion becomes zero in a burst continuance section.

6. The distortion correction control apparatus according to claim 1, further comprising a unit that adjusts the parameters based on an error between the input signal as a reference signal and the branch signal.

7. The distortion correction control apparatus according to claim 1, wherein the distortion correction coefficient multiplied by the input signal of the transmission target or added to the input signal of the transmission target is a correction coefficient according to a passage of time from switching between presence and absence of the input signal.

8. The distortion correction control apparatus according to claim 1, wherein correction of the distortion is carried out for the input signal with respect to both an amplitude and a phase.

9. The distortion correction control apparatus according to claim 1, further comprising a unit that adjusts a size of the distortion correction coefficient according to the amplitude of the input signal.

10. The burst distortion correction control apparatus according to claim 1, further comprising a unit that obtains average power of the input signal to adjust the distortion correction coefficient according to an average size of the input signal.

11. A distortion correction control method of compensating for burst distortion of a transmission amplifier caused by a burst of an input signal of a transmission target, comprising:
   generating a distortion correction coefficient having reverse characteristics to the burst distortion;
   multiplying the generated distortion correction coefficient by the input signal or adding the generated distortion correction coefficient to the input signal, upon reception of burst information notifying of switching between presence and absence of the input signal; and
   updating, based on the input signal and a branch signal fed back as an output signal of the transmission amplifier, parameters of functions used for adaptively generating the distortion correction coefficient, and inputting the updated parameters for generating the distortion correction coefficient.

* * * * *